(12) United States Patent
Chen et al.

(10) Patent No.: US 12,567,663 B2
(45) Date of Patent: Mar. 3, 2026

(54) MILLIMETER-WAVE OPTICAL FIBER ANTENNA MODULE AND METHOD FOR MANUFACTURING THE SAME

(71) Applicant: UNIVERSAL SCIENTIFIC INDUSTRIAL ( SHANGHAI ) CO., LTD., Shanghai (CN)

(72) Inventors: I-Ling Chen, Shanghai (CN); Yu-Cheng Liu, Shanghai (CN)

(73) Assignee: UNIVERSAL SCIENTIFIC INDUSTRIAL ( SHANGHAI ) CO., LTD., Shanghai (CN)

( * ) Notice: Subject to any disclaimer, the term of this patent is extended or adjusted under 35 U.S.C. 154(b) by 93 days.

(21) Appl. No.: 18/626,259

(22) Filed: Apr. 3, 2024

(65) Prior Publication Data

US 2025/0246796 A1 Jul. 31, 2025

(30) Foreign Application Priority Data

Jan. 30, 2024 (CN) .......................... 202410130684.0

(51) Int. Cl.
*H01Q 1/22* (2006.01)
*H05K 1/02* (2006.01)
(Continued)

(52) U.S. Cl.
CPC ......... *H01Q 1/2283* (2013.01); *H05K 1/0243* (2013.01); *H05K 3/284* (2013.01); *H05K 3/34* (2013.01); *H05K 2201/10098* (2013.01)

(58) Field of Classification Search
CPC ............... H01Q 1/2283; H05K 1/0243; H05K 2201/10098; H05K 3/284; H05K 3/34
See application file for complete search history.

(56) References Cited

U.S. PATENT DOCUMENTS

2014/0306111 A1* 10/2014 Mohd Shapee ......... H10F 71/00
438/57
2016/0277209 A1* 9/2016 Leiba .................... H04W 40/12
(Continued)

FOREIGN PATENT DOCUMENTS

CN 101493556 B 2/2012
CN 109995389 A 7/2019
(Continued)

*Primary Examiner* — Thien M Le
(74) *Attorney, Agent, or Firm* — Li & Cai Intellectual Property (USA) Office

(57) ABSTRACT

A millimeter-wave optical fiber antenna module and a method for manufacturing the same are provided. The millimeter-wave optical fiber antenna module includes a packaging module, an antenna member, and a second encapsulant. The packaging module includes a first circuit substrate, a first placement member, a first chip assembly, a second chip assembly, an optical fiber connector, and a first encapsulant. The first circuit substrate has a top surface and a bottom surface. The first placement member is disposed on the top surface. The first placement member has first grooves, and the first grooves are linear and parallel to one another. The first chip assembly and the second chip assembly are located on the top surface. The first chip assembly is electrically connected to the second chip assembly. The first chip assembly and the second chip assembly respectively include an integrated circuit chip and an integrated optical circuit chip.

10 Claims, 9 Drawing Sheets

(51) Int. Cl.
    *H05K 3/28*          (2006.01)
    *H05K 3/34*          (2006.01)

(56)             References Cited

U.S. PATENT DOCUMENTS

| | | | |
|---|---|---|---|
| 2016/0277976 A1* | 9/2016 | Takahashi | H04B 7/0617 |
| 2019/0267716 A1* | 8/2019 | Yoon | H01Q 13/0233 |
| 2019/0267722 A1* | 8/2019 | Yoon | H01Q 21/22 |
| 2020/0274617 A1* | 8/2020 | Djukic | H04B 10/25753 |
| 2021/0037458 A1* | 2/2021 | Shojaeifard | G06V 20/10 |
| 2022/0221583 A1* | 7/2022 | Rolland | G01S 7/4917 |
| 2022/0286931 A1* | 9/2022 | Shojaeifard | G06V 20/00 |
| 2022/0384956 A1 | 12/2022 | Alpman et al. | |

FOREIGN PATENT DOCUMENTS

| | | |
|---|---|---|
| CN | 215987011 U2 | 3/2022 |
| TW | I791509 B | 2/2023 |
| TW | 202323883 A | 6/2023 |
| TW | 202327114 A | 7/2023 |

* cited by examiner

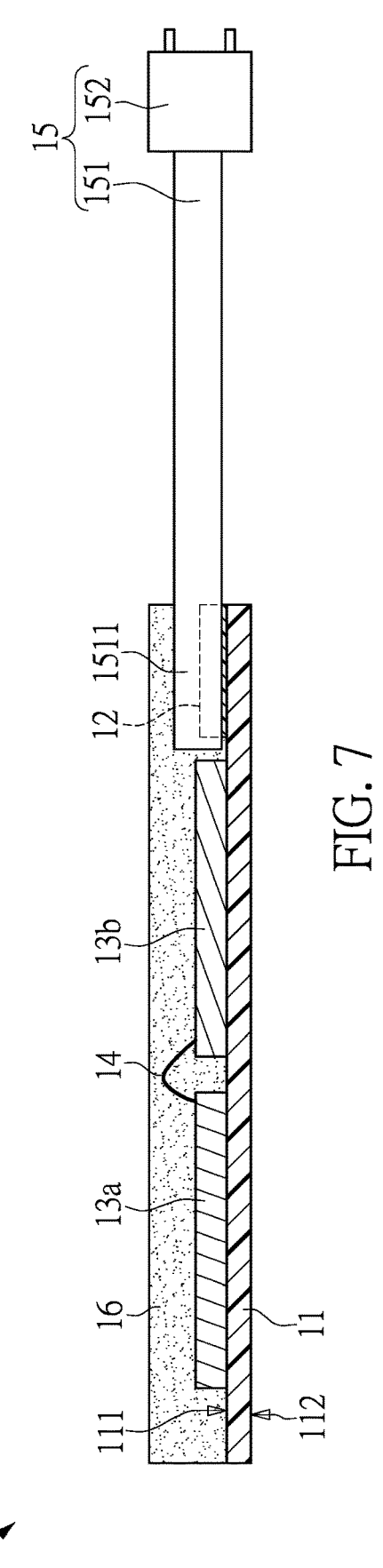
FIG. 7
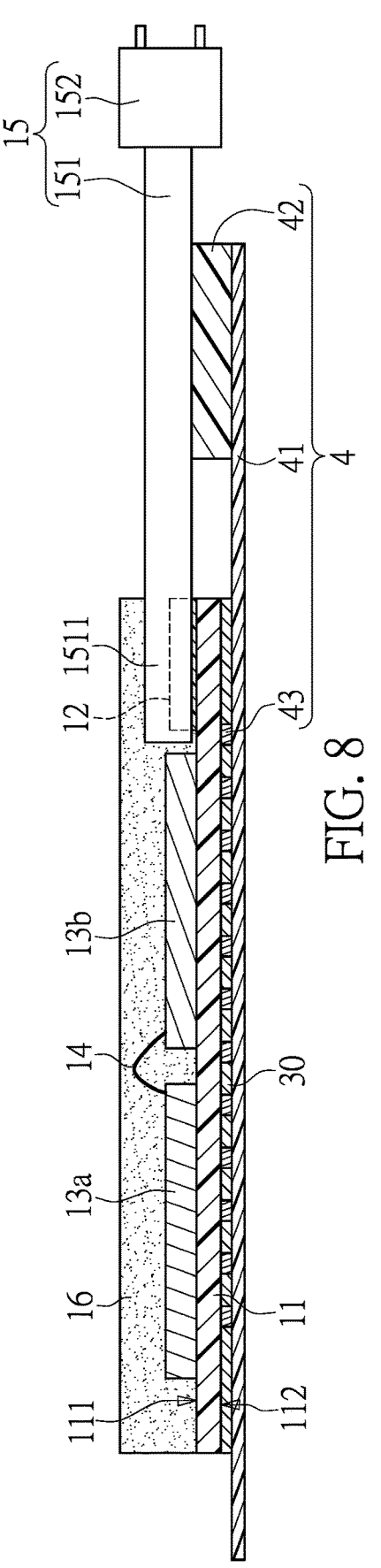
FIG. 8

MILLIMETER-WAVE OPTICAL FIBER ANTENNA MODULE AND METHOD FOR MANUFACTURING THE SAME

CROSS-REFERENCE TO RELATED PATENT APPLICATION

This application claims the benefit of priority to China Patent Application No. 202410130684.0, filed on Jan. 30, 2024, in the People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an antenna module, and more particularly to an antenna module that is capable of both optical fiber transmission and circuitry transmission.

BACKGROUND OF THE DISCLOSURE

Antenna communication technology is commonly used in the lives of people. In the existing technology, an antenna installed in a mobile electronic device is directly connected to the communication system. When a user moves indoors, the signal is easily obscured by the building, resulting in poor signal reception. In addition, existing antennas generally use copper wires to transmit signals, such that the loss of the signal increases with the increase in transmission path, signal frequency, and energy, while waste heat is generated. Specifically, the antenna is susceptible to high temperatures that are detrimental to operation when the antenna is combined with the mobile electronic device.

With the advancement of communication technology, millimeter-wave communication has the advantage of high transmission rate. Therefore, how to improve the structural design to expand the application range of millimeter-wave antenna module and enhance the signal transmission effect to overcome the above defects of the traditional antenna, has become an important issue to be addressed in the industry.

SUMMARY OF THE DISCLOSURE

In response to the above-referenced technical inadequacies, the present disclosure provides a millimeter-wave optical fiber antenna module and a method for manufacturing the millimeter-wave optical fiber antenna module.

In order to solve the above-mentioned problems, one of the technical aspects adopted by the present disclosure is to provide a method for manufacturing a millimeter-wave optical fiber antenna module. The method includes: a process (1) of providing a first circuit substrate; the first circuit substrate having a top surface and a bottom surface; a process (2) of disposing a first placement member having a plurality of first grooves on one side of the top surface of the first circuit substrate; the plurality of first grooves being linear and parallel to one another; a process (3) of disposing a first chip assembly and a second chip assembly on the top surface; one of the first chip assembly and the second chip assembly including an integrated circuit chip and another one of the first chip assembly and the second chip assembly including an integrated optical circuit chip; a process (4) of disposing a solder wire to electrically connect the first chip assembly and the second chip assembly; a process (5) of providing an optical fiber connector, the optical fiber connector including a plurality of optical fiber bundles and a connection interface, and the connection interface being connected to the plurality of optical fiber bundles and located outside of the first circuit substrate; one end of each of the plurality of optical fiber bundles being a connection end, and the connection ends being respectively located on the plurality of first grooves to form an optical fiber array; a process (6) of disposing a first encapsulant on the top surface of the first circuit substrate; the first encapsulant covering the optical fiber array, the first chip assembly, and the second chip assembly to form a packaging module; a process (7) of disposing the packaging module on an antenna member, the antenna member including a second circuit substrate that is flexible, a second placement member having a plurality of second grooves being disposed on a surface of the second circuit substrate, and the plurality of second grooves being linear and parallel to one another; a part of each of the optical fiber bundles located outside of the first encapsulant abutting against each of the second grooves, respectively; and a process (8) of disposing a second encapsulant on the surface of the second circuit substrate; the second encapsulant covering the first encapsulant, the plurality of optical fiber bundles disposed on the plurality of second grooves, and the second placement member.

In one of the possible or preferred embodiments, the process (3) further includes disposing a conductive member on the top surface of the first circuit substrate; the conductive member being located within the first encapsulant; following processes are performed after the process (6): a process (6-1) of forming a perforation corresponding to the conductive member in the first encapsulant; the perforation extending to a surface of the conductive member; a process (6-2) of placing a conductive component in the perforation; one end of the conductive component being connected to the conductive member, and another end of the conductive component being exposed from the first encapsulant; and a process (6-3) of disposing a cooling chip assembly outside the first encapsulant; the cooling chip assembly being connected to the conductive component; a part of the cooling chip assembly being encapsulated by the second encapsulant, and another part of the cooling chip assembly being exposed from the second encapsulant.

In one of the possible or preferred embodiments, in the process (2), the plurality of first grooves are formed by selective etching.

In one of the possible or preferred embodiments, in the process (5), the connection ends of the optical fiber bundles are respectively connected to the first grooves through an optical adhesive.

In one of the possible or preferred embodiments, in the process (6), the first encapsulant is disposed by screen printing.

In one of the possible or preferred embodiments, in the process (7), a conductive adhesive layer is disposed between the bottom surface of the first circuit substrate and the surface of the second circuit substrate.

In one of the possible or preferred embodiments, in the process (8), the second encapsulant is rubber.

In order to solve the above-mentioned problems, another one of the technical aspects adopted by the present disclosure is to provide a millimeter-wave optical fiber antenna module. The millimeter-wave optical fiber antenna module includes a packaging module, an antenna member, and a second encapsulant. The packaging module includes a first circuit substrate, a first placement member, a first chip assembly, a second chip assembly, an optical fiber connector, and a first encapsulant. The first circuit substrate has a top surface and a bottom surface. The first placement member is disposed on the top surface. The first placement member has a plurality of first grooves, and the plurality of first grooves are linear and parallel to one another. The first chip assembly and the second chip assembly are located on the top surface. The first chip assembly is electrically connected to the second chip assembly. One of the first chip assembly and the second chip assembly includes an integrated circuit chip, and another one of the first chip assembly and the second chip assembly includes an integrated optical circuit chip. The optical fiber connector includes a plurality of optical fiber bundles and a connection interface. The connection interface is connected to the plurality of optical fiber bundles and located outside of the first circuit substrate, one end of each of the plurality of optical fiber bundles is a connection end, and the connection ends are respectively located on the plurality of first grooves to form an optical fiber array. The first encapsulant is disposed on the top surface of the first circuit substrate. The first encapsulant covers the optical fiber array, the first chip assembly, and the second chip assembly. The antenna member is electrically connected to the packaging module. The antenna member includes a second circuit substrate and a second placement member. The second circuit substrate is flexible. The second placement member is disposed on a surface of the second circuit substrate. The second placement member has a plurality of second grooves, and a part of each of the optical fiber bundles located outside of the first encapsulant abuts against each of the second grooves, respectively. The second encapsulant covers the first encapsulant, the optical fiber bundles disposed on the second grooves, and the second placement member.

In one of the possible or preferred embodiments, the millimeter-wave optical fiber antenna module further includes a cooling chip assembly disposed outside the packaging module. A part of the cooling chip assembly is encapsulated by the second encapsulant, and another part of the cooling chip assembly is exposed from the second encapsulant. The packaging module further includes a conductive member and a conductive component, the conductive member is disposed on the first circuit substrate, and a perforation corresponding to the conductive member is formed in the first encapsulant. The conductive component is disposed in the perforation, and two ends of the conductive component are connected to the conductive member and the cooling chip assembly, respectively.

In one of the possible or preferred embodiments, the second encapsulant is rubber.

Therefore, the millimeter-wave optical fiber antenna module provided by the present disclosure includes the integrated circuit chip, the integrated optical circuit chip, the antenna module, and the optical fiber connector. High bandwidth and high speed transmission characteristics of an optical fiber can be used, and digital signal transmission and power supply can be integrated to reduce the cost of extra wiring and the complexity of the technology.

Furthermore, because the millimeter-wave optical fiber antenna module provided by the present disclosure includes the integrated circuit chip, the integrated optical circuit chip, the antenna module, and the optical fiber connector, transmission and receiving capabilities of the millimeter-wave optical fiber antenna module can be improved.

According to certain embodiments, the millimeter-wave optical fiber antenna module provided by the present disclosure includes the cooling chip assembly to be suitable for use in a high-temperature operation environment.

According to certain embodiments, the millimeter-wave optical fiber antenna module provided by the present disclosure occupies a small volume and is manufactured using soft and flexible materials, such that the millimeter-wave optical fiber antenna module can be fixed to a surface of any structure.

According to certain embodiments, because of structures (e.g., the second circuit substrate being flexible) and materials (e.g., the second encapsulant being rubber) of the millimeter-wave optical fiber antenna module, the millimeter-wave optical fiber antenna module can be lightweight, waterproof, shockproof, and impact-resistant.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIG. 7 to FIG. 9 are schematic views of the processes of the method for manufacturing the millimeter-wave optical fiber antenna module according to one embodiment of the present disclosure.

DETAILED DESCRIPTION OF THE EXEMPLARY EMBODIMENTS

Figure 1:
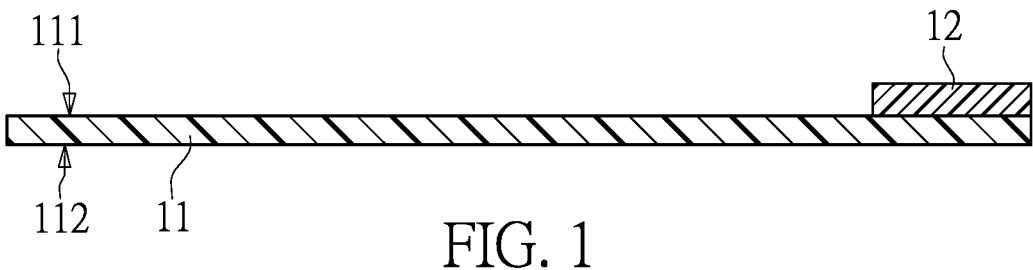
FIG. 1 is a schematic view of processes of a method for manufacturing a millimeter-wave optical fiber antenna module according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Embodiments

Figure 2:
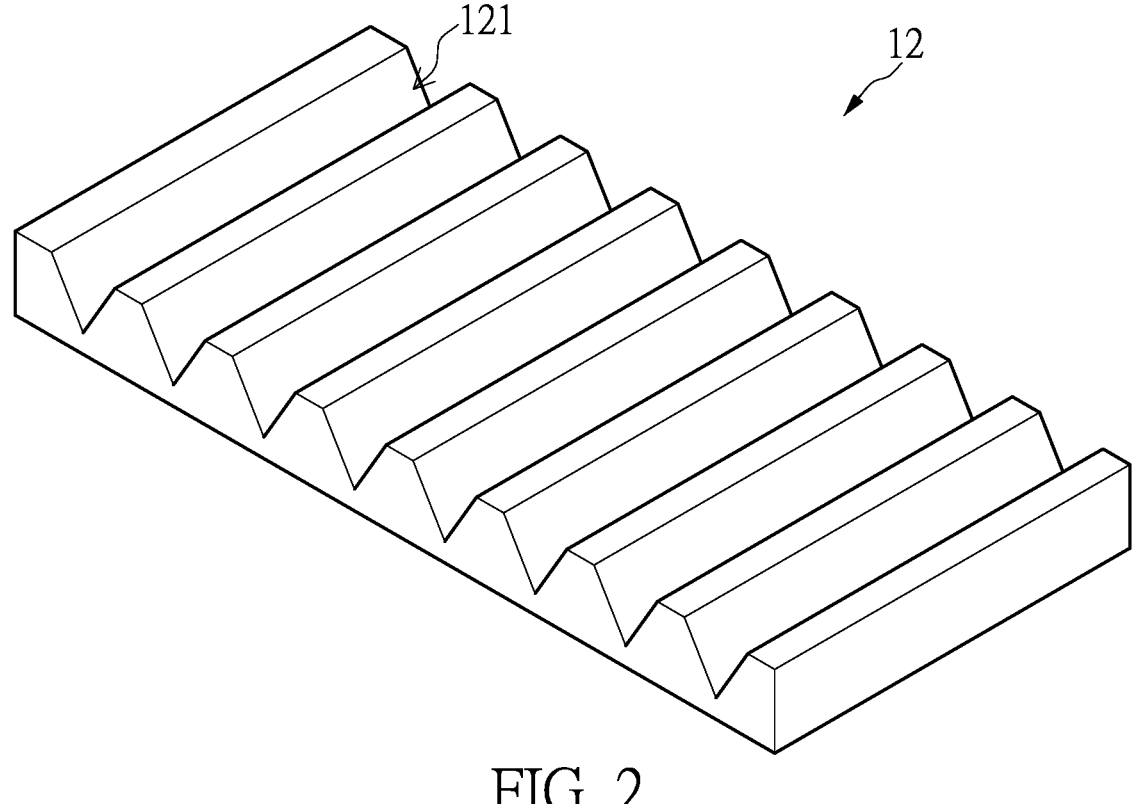
FIG. 2 is a schematic view of a first placement member according to one embodiment of the present disclosure.
Figure 4:
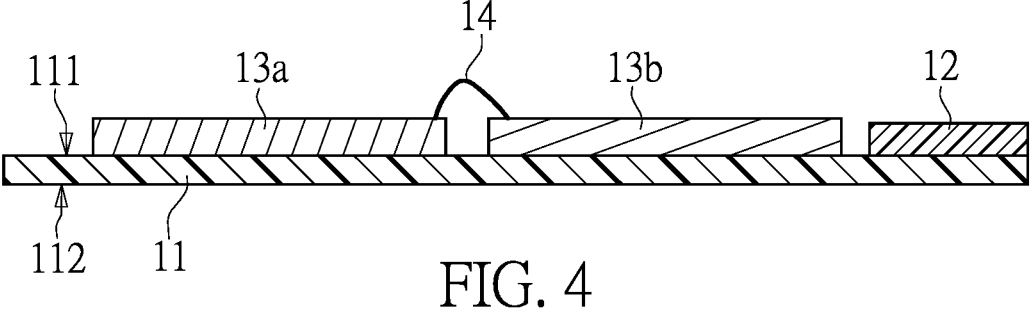
Figure 5:
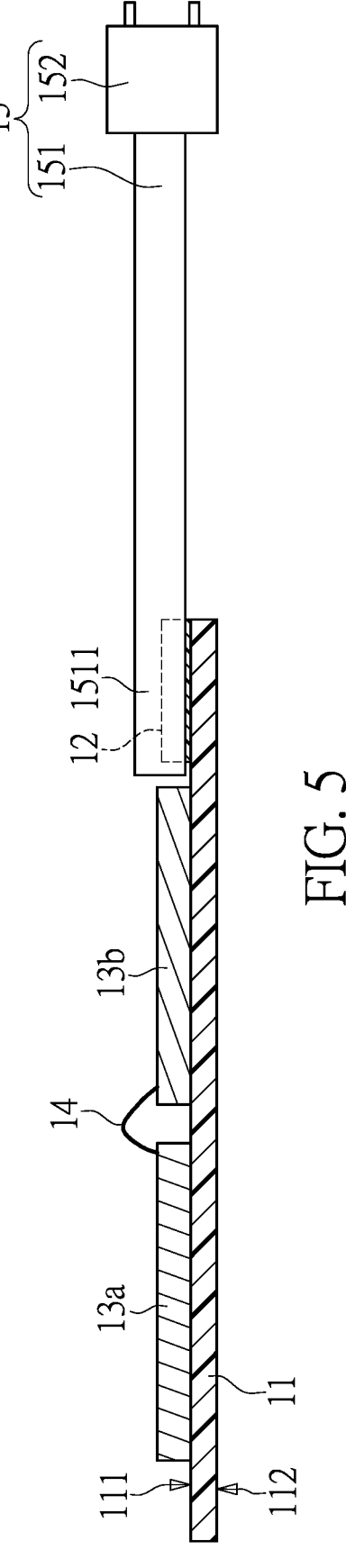
Figure 6:
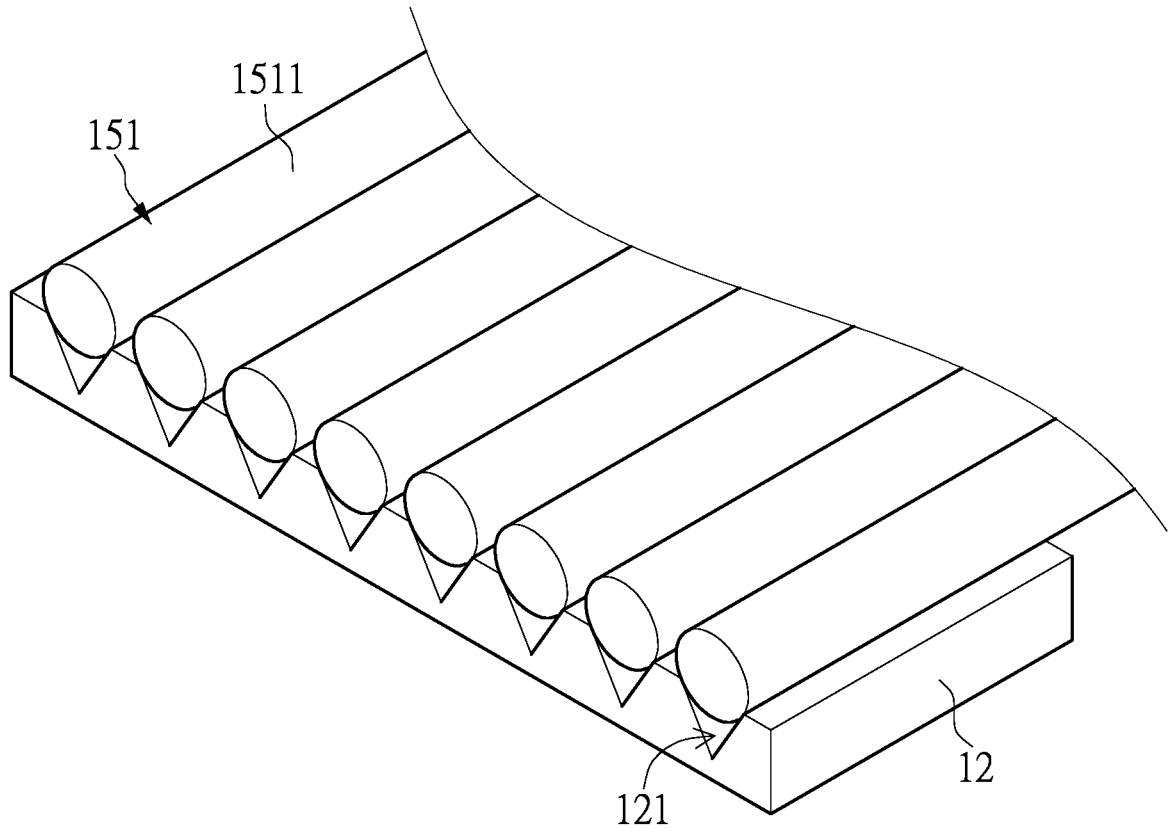
FIG. 6 is a schematic view of optical fiber bundles relative to the first placement member according to one embodiment of the present disclosure.

Referring to FIG. 1 to FIG. 9, FIG. 1, FIG. 3 to FIG. 5, and FIG. 7 to FIG. 9 are schematic views of processes of a method for manufacturing a millimeter-wave optical fiber antenna module according to one embodiment of the present disclosure. FIG. 2 is a schematic view of a first placement member 12 according to one embodiment of the present disclosure. FIG. 6 is a schematic view of optical fiber bundles 15 relative to the first placement member 12 according to one embodiment of the present disclosure. The method for manufacturing the millimeter-wave optical fiber antenna module at least includes a process (1) to a process (8).

As shown in FIG. 1, the process (1) and the process (2) are performed. A first circuit substrate 11 is provided, and the first circuit substrate 11 has a top surface 111 and a bottom surface 112. The first placement member 12 having a plurality of first grooves 121 is provided on one side of the top surface 111 of the first circuit substrate 11. The plurality of first grooves 121 are linear and parallel to one another. According to certain embodiments, the plurality of first grooves 121 are formed by selective etching on the first circuit substrate 11. In this embodiment, cross-sectional surfaces of the plurality of first grooves 121 are substantially V-shaped, as shown in FIG. 2. However, the present disclosure is not limited thereto. In certain embodiments, cross-sectional surfaces of the plurality of first grooves 121 are substantially U-shaped.

Figure 3:
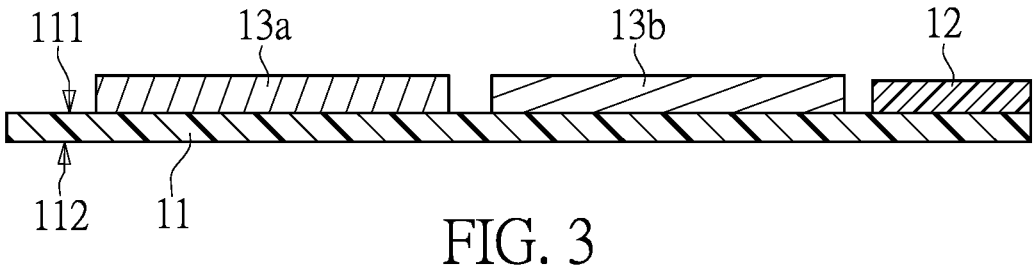
FIG. 3 to FIG. 5 are schematic views of the processes of the method for manufacturing the millimeter-wave optical fiber antenna module according to one embodiment of the present disclosure.

As shown in FIG. 3, the process (3) is performed. A first chip assembly 13a and a second chip assembly 13b are disposed on the top surface 111. One of the first chip assembly 13a and the second chip assembly 13b includes an integrated circuit chip and another one of the first chip assembly 13a and the second chip assembly 13b includes an integrated optical circuit chip, but the present disclosure is not limited thereto. In this embodiment, the first chip assembly 13a includes an integrated circuit chip, the second chip assembly 13b includes an integrated optical circuit chip, and the integrated optical circuit chip is adjacent to the aforementioned first placement member 12. As shown in FIG. 4, in the process (4), a solder wire 14 is disposed to electrically connect the first chip assembly 13a and the second chip assembly 13b.

As shown in FIG. 5, the process (5) is performed. An optical fiber connector 15 is provided. The optical fiber connector 15 includes a plurality of optical fiber bundles 151 and a connection interface 152, and the connection interface 152 is connected to the plurality of optical fiber bundles 151 and located outside of the first circuit substrate 11. One end of each of the plurality of optical fiber bundles 151 is a connection end 1511, and the connection ends 1511 are respectively located on the plurality of first grooves 151 to form an optical fiber array, as shown in FIG. 6. According to certain embodiments, the connection ends 1511 of the optical fiber bundles 151 are respectively connected to the first grooves 121 through an optical adhesive. For example, the optical adhesive is coated on the assembly of the optical fiber bundles 151 and the first grooves 121, and ultraviolet light is used to illuminate and cure the optical adhesive, such that the optical fiber bundles 151 is fixed to the first grooves 121.

As shown in FIG. 7, the process (6) is performed. A first encapsulant 16 is provided on the top surface 111 of the first circuit substrate 11. The first encapsulant 16 covers the optical fiber array, the first chip assembly 13a, and the second chip assembly 13b to form a packaging module 20. According to certain embodiments, in the process (6), the first encapsulant 16 is disposed by screen printing.

As shown in FIG. 8, the process (7) is performed. The packaging module 20 is disposed on an antenna member 4. The antenna member 4 includes a second circuit substrate 41 that is flexible, a second placement member 42 having a plurality of second grooves is disposed on a surface of the second circuit substrate 41, and the plurality of second grooves are linear and parallel to one another. A part of each of the optical fiber bundles 151 located outside of the first encapsulant 16 abuts against each of the second grooves, respectively. According to certain embodiments, cross-sectional surfaces of the plurality of second grooves are substantially V-shaped, as shown in FIG. 2. However, the present disclosure is not limited thereto. In certain embodiments, cross-sectional surfaces of the plurality of second grooves are substantially U-shaped. According to certain embodiments, the antenna member 4 is a patch antenna, a conductive pattern layer 43 is formed on the surface of the second circuit substrate 41, and the conductive pattern layer 43 can be made of a thin metal plate. According to certain embodiments, in the process (7), a conductive adhesive layer 30 is disposed between the bottom surface 112 of the first circuit substrate 11 and the surface of the second circuit substrate 41.

Figure 9:
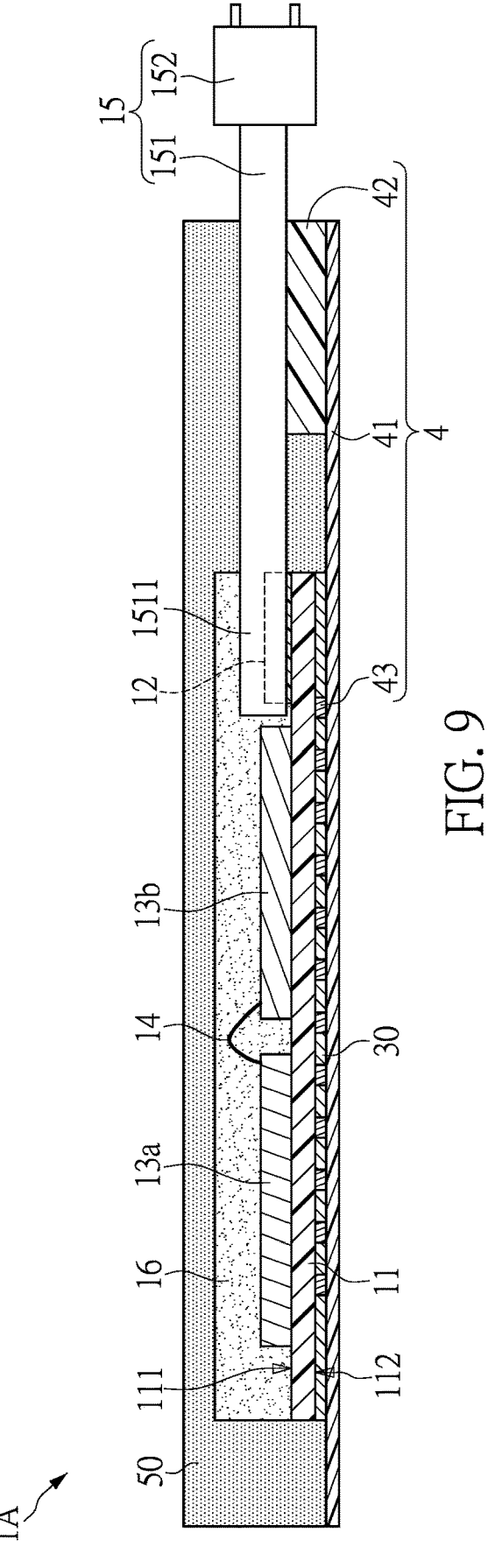

As shown in FIG. 9, the process (8) is performed. A second encapsulant 50 is disposed on the surface of the second circuit substrate 41. The second encapsulant 50 covers the first encapsulant 16, the plurality of optical fiber bundles 151 disposed on the plurality of second grooves, and the second placement member 42, such that a millimeter-wave optical fiber antenna module 1A is manufactured. According to certain embodiments, the second encapsulant 50 is a soft material that can be rubber, but is not limited thereto.

Figures 10, 11:
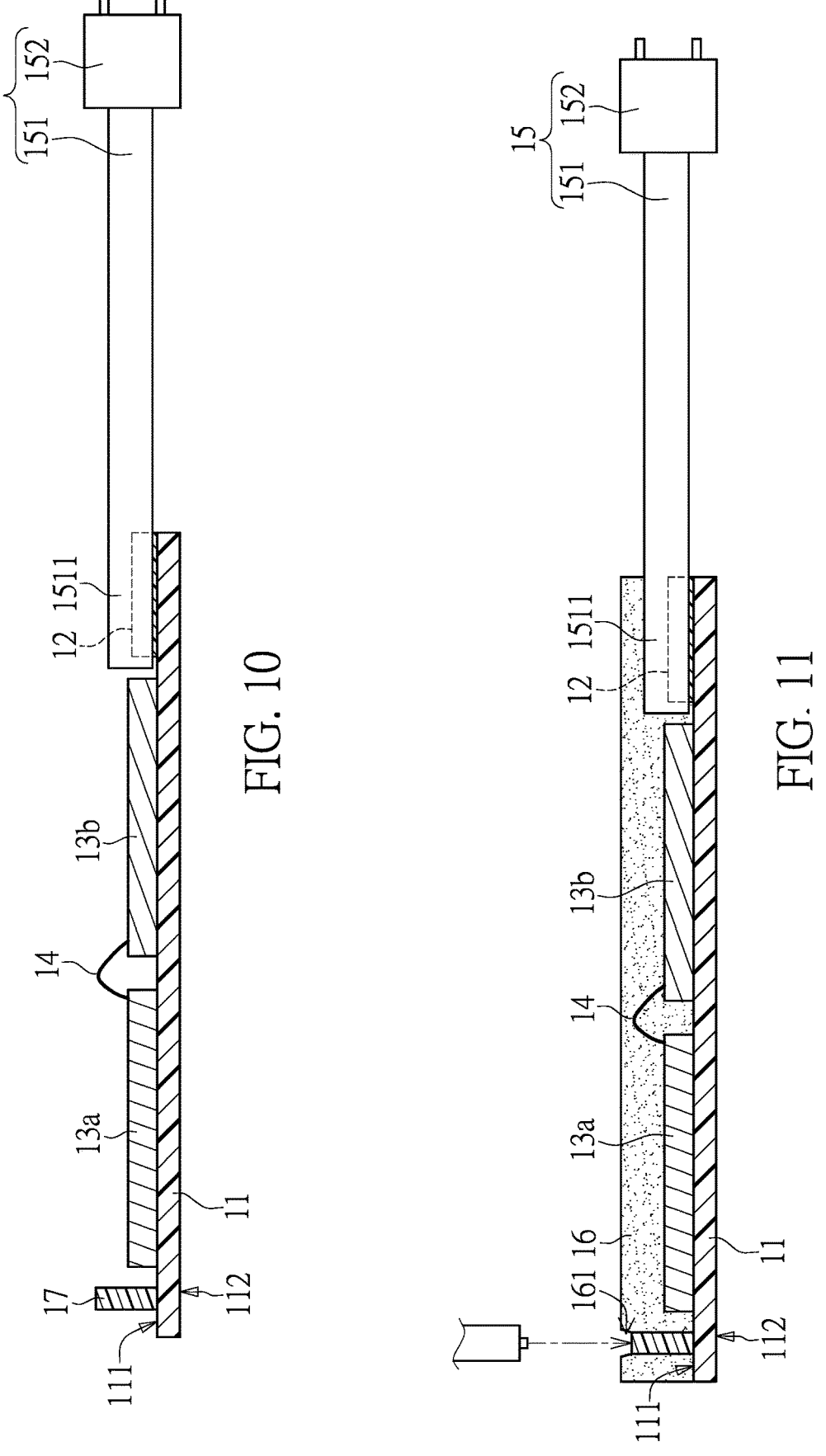
FIG. 10 to FIG. 14 are schematic views of the processes of the method for manufacturing the millimeter-wave optical fiber antenna module according to an alternative embodiment of the present disclosure.

Referring to FIG. 10 to FIG. 14, FIG. 10 to FIG. 14 are schematic views of the processes of the method for manufacturing the millimeter-wave optical fiber antenna module according to an alternative embodiment of the present disclosure. As shown in FIG. 10, in this embodiment, the process (3) further includes disposing a conductive member 17 on the top surface 111 of the first circuit substrate 11, and the conductive member 17 is located within the first encapsulant 16. The conductive member 17 can be a column structure or a wall structure, and is not limited in the present disclosure. According to certain embodiments, a material of the conductive member 17 is copper.

As shown in FIG. 11, after the process (6), a process (6-1) is performed. A perforation 161 is formed corresponding to the conductive member 17 in the first encapsulant 16. The perforation 161 extends to a surface of the conductive member 17. According to certain embodiments, the perforation 161 is formed by laser perforation.

Figure 12:
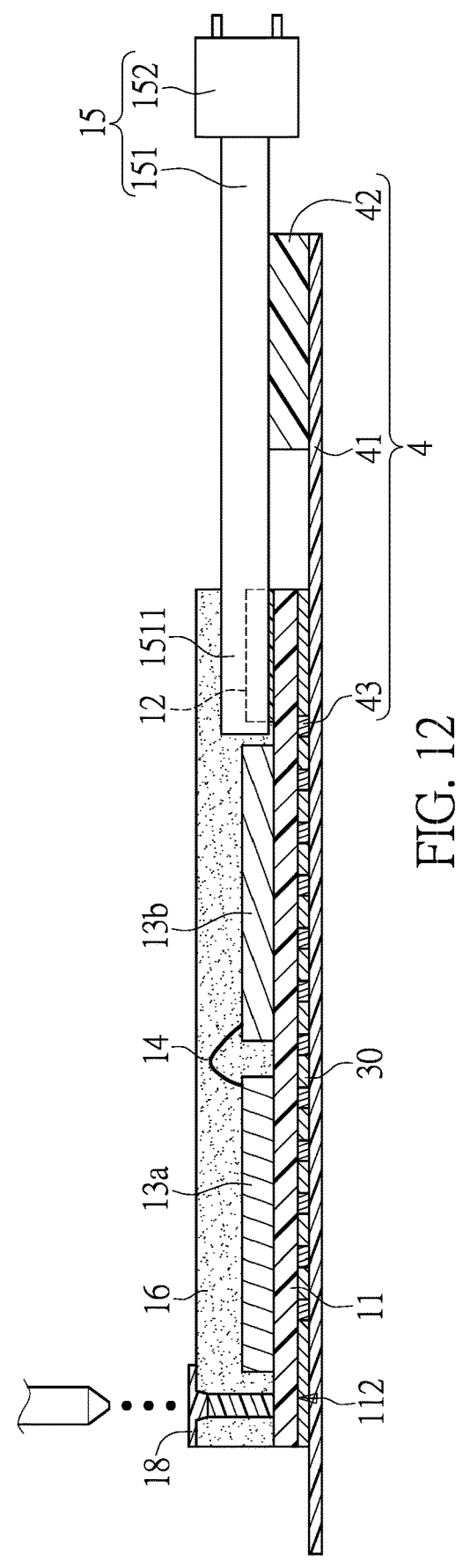
Figure 13:
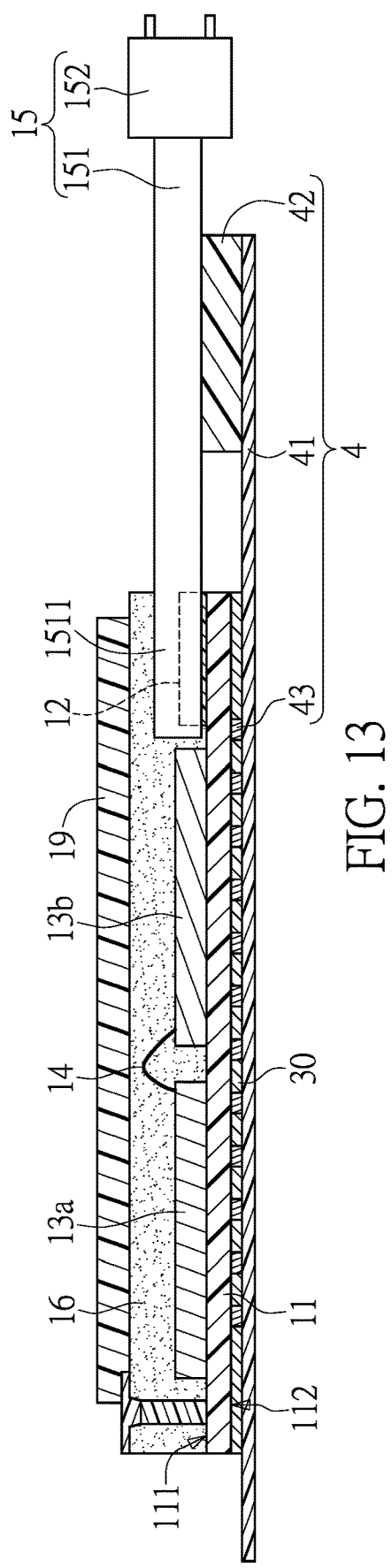

Afterwards, a process (6-2) is performed. A conductive component 18 is placed in the perforation 161. One end of the conductive component 18 is connected to the conductive member 17, and another end of the conductive component 18 is exposed from the first encapsulant 163, as shown in FIG. 12. The conductive component 18 can be a solder paste, but is not limited thereto. A process (6-3) is then performed. A cooling chip assembly 19 is disposed outside the first encapsulant 16. The cooling chip assembly 19 is connected to the conductive component 18, as shown in FIG. 13. Subsequently, the process (8) of disposing the second encapsulant 50 is performed. A part of the cooling chip assembly 19 is encapsulated by the second encapsulant 50, and another part of the cooling chip assembly 19 is exposed from the second encapsulant 50, as shown in FIG. 14.

Reference is further made to FIG. 9, and FIG. 9 shows a millimeter-wave optical fiber antenna module according to one embodiment of the present disclosure. The millimeter-wave optical fiber antenna module includes the packaging module 20, the antenna member 4, and the second encapsulant 50. Details regarding the packaging module 20, the antenna member 4, and the second encapsulant 50 can be referred to in the aforementioned descriptions.

Figure 14:
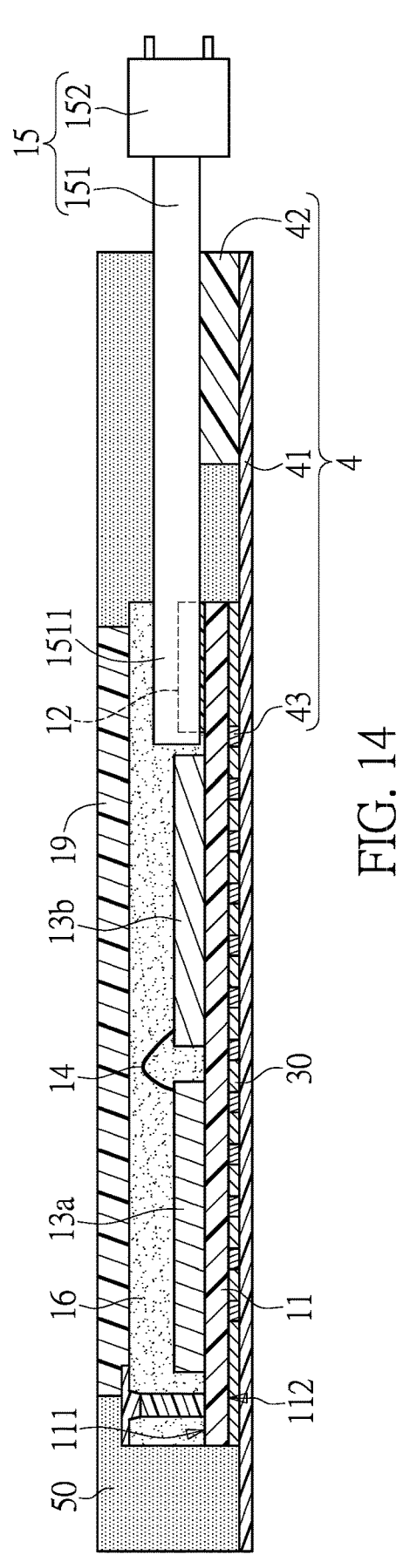

Reference is further made to FIG. 14, and FIG. 14 shows a millimeter-wave optical fiber antenna module 1B according to an alternative embodiment of the present disclosure. The millimeter-wave optical fiber antenna module 1B of this embodiment further includes the cooling chip assembly 19. The cooling chip assembly 19 is located outside the packaging module 20. A part of the cooling chip assembly 19 is encapsulated by the second encapsulant 50, and another part of the cooling chip assembly 19 is exposed from the second encapsulant 50. The packaging module 20 further includes a conductive member 17 and a conductive component 18, the conductive member 17 is disposed on the first circuit substrate 11, and a perforation 161 corresponding to the conductive member 17 is formed in the first encapsulant 16. The conductive component 18 is disposed in the perforation 161, and two ends of the conductive component 18 are connected to the conductive member 17 and the cooling chip assembly 19, respectively. Details regarding structure and material of the conductive member 17 and the conductive component 18 can be referred to in the aforementioned descriptions.

Beneficial Effects of the Embodiments

In conclusion, the millimeter-wave optical fiber antenna module of embodiments of the present disclosure is able to be arbitrarily fixed in a location with good reception and occupies a small volume, thereby saving the cost of additional wiring configuration. Since the millimeter-wave optical fiber antenna module has optical fibers, the signal transmission path is short, the loss is small, no excess heat is generated, and safety is maintained while high-speed signals are transmitted.

According to certain embodiments, the millimeter-wave optical fiber antenna module provided by the present disclosure includes the cooling chip assembly to be suitable for use in a high-temperature operation environment.

According to certain embodiments, the millimeter-wave optical fiber antenna module provided by the present disclosure has occupies a small volume and is manufactured using soft and flexible materials, such that the millimeter-wave optical fiber antenna module can be fixed to a surface of any structure.

According to certain embodiments, because of structures (e.g., the second circuit substrate being flexible) and materials (e.g., the second encapsulant being rubber) of the millimeter-wave optical fiber antenna module, the millimeter-wave optical fiber antenna module can be lightweight, waterproof, shockproof, and impact-resistant.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method for manufacturing a millimeter-wave optical fiber antenna module, comprising:

a first process of providing a first circuit substrate, wherein the first circuit substrate has a top surface and a bottom surface;

a second process of disposing a first placement member having a plurality of first grooves on one side of the top surface of the first circuit substrate, wherein the plurality of first grooves are linear and parallel to one another;

a third process of disposing a first chip assembly and a second chip assembly on the top surface, wherein one of the first chip assembly and the second chip assembly includes an integrated circuit chip, and another one of the first chip assembly and the second chip assembly includes an integrated optical circuit chip;

a fourth process of disposing a solder wire to electrically connect the first chip assembly and the second chip assembly;

a fifth process of providing an optical fiber connector, wherein the optical fiber connector includes a plurality of optical fiber bundles and a connection interface, and the connection interface is connected to the plurality of optical fiber bundles and located outside of the first circuit substrate; wherein one end of each of the plurality of optical fiber bundles is a connection end, and the connection ends are respectively located on the plurality of first grooves to form an optical fiber array;

a sixth process of disposing a first encapsulant on the top surface of the first circuit substrate, wherein the first encapsulant covers the optical fiber array, the first chip assembly, and the second chip assembly to form a packaging module;

a seventh process of disposing the packaging module on an antenna member, wherein the antenna member includes a second circuit substrate that is flexible, a second placement member having a plurality of second grooves is disposed on a surface of the second circuit substrate, and the plurality of second grooves are linear and parallel to one another; wherein a part of each of the optical fiber bundles located outside of the first encapsulant abuts against each of the second grooves, respectively; and an eighth process of disposing a second encapsulant on the surface of the second circuit substrate, wherein the second encapsulant covers the first encapsulant, the plurality of optical fiber bundles disposed on the plurality of second grooves, and the second placement member.

2. The method according to claim 1, wherein the third process further includes disposing a conductive member on the top surface of the first circuit substrate, wherein the conductive member is located within the first encapsulant; wherein following processes are performed after the sixth process:

a first sub-process of forming a perforation corresponding to the conductive member in the first encapsulant, wherein the perforation extends to a surface of the conductive member;

a second sub-process of placing a conductive component in the perforation, wherein one end of the conductive component is connected to the conductive member, and another end of the conductive component is exposed from the first encapsulant; and a third sub-process of disposing a cooling chip assembly outside the first encapsulant, wherein the cooling chip assembly is connected to the conductive component; wherein a part of the cooling chip assembly is encapsulated by the second encapsulant, and another part of the cooling chip assembly is exposed from the second encapsulant.

3. The method according to claim 1, wherein, in the second process, the plurality of first grooves are formed by selective etching.

4. The method according to claim 1, wherein, in the fifth process, the connection ends of the optical fiber bundles are respectively connected to the first grooves through an optical adhesive.

5. The method according to claim 1, wherein, in the sixth process, the first encapsulant is disposed by screen printing.

6. The method according to claim 1, wherein, in the seventh process, a conductive adhesive layer is disposed between the bottom surface of the first circuit substrate and the surface of the second circuit substrate.

7. The method according to claim 1, wherein, in the eighth process, the second encapsulant is rubber.

8. A millimeter-wave optical fiber antenna module, comprising:

a packaging module including:

a first circuit substrate having a top surface and a bottom surface;

a first placement member disposed on the top surface, wherein the first placement member has a plurality of first grooves, and the plurality of first grooves are linear and parallel to one another;

a first chip assembly and a second chip assembly located on the top surface, wherein the first chip assembly is electrically connected to the second chip assembly; wherein one of the first chip assembly and the second chip assembly includes an integrated circuit chip, and another one of the first chip assembly and the second chip assembly includes an integrated optical circuit chip;

an optical fiber connector including a plurality of optical fiber bundles and a connection interface, wherein the connection interface is connected to the plurality of optical fiber bundles and located outside of the first circuit substrate, one end of each of the plurality of optical fiber bundles is a connection end, and the connection ends are respectively located on the plurality of first grooves to form an optical fiber array; and a first encapsulant disposed on the top surface of the first circuit substrate, wherein the first encapsulant covers the optical fiber array, the first chip assembly, and the second chip assembly;

an antenna member electrically connected to the packaging module, wherein the antenna member includes:

a second circuit substrate being flexible; and a second placement member disposed on a surface of the second circuit substrate, wherein the second placement member has a plurality of second grooves, and a part of each of the optical fiber bundles located outside of the first encapsulant abuts against each of the second grooves, respectively; and a second encapsulant covering the first encapsulant, the optical fiber bundles disposed on the second grooves, and the second placement member.

9. The millimeter-wave optical fiber antenna module according to claim 8, further comprising: a cooling chip assembly disposed outside the packaging module; wherein a part of the cooling chip assembly is encapsulated by the second encapsulant, and another part of the cooling chip assembly is exposed from the second encapsulant;

wherein the packaging module further includes a conductive member and a conductive component, the conductive member is disposed on the first circuit substrate, and a perforation corresponding to the conductive member is formed in the first encapsulant; wherein the conductive component is disposed in the perforation, and two ends of the conductive component are connected to the conductive member and the cooling chip assembly, respectively.

10. The millimeter-wave optical fiber antenna module according to claim 8, wherein the second encapsulant is rubber.

* * * * *